Oct. 27, 1970 J. H. WICKENS 3,537,033

ASTABLE MULTIVIBRATOR

Filed July 3, 1968

INVENTOR.

JUSTIN H. WICKENS

BY

Charles [signature]

ATTORNEYS

United States Patent Office 3,537,033
Patented Oct. 27, 1970

3,537,033

ASTABLE MULTIVIBRATOR

Justin H. Wickens, 3025 Seeno Circle,
Marina, Calif. 93933

Filed July 3, 1968, Ser. No. 742,390
Int. Cl. H03k *3/282*
U.S. Cl. 331—113 8 Claims

ABSTRACT OF THE DISCLOSURE

A voltage controlled astable multivibrator device having a pair of switching transistors and a constant current source that provides a variable bias current level to the pair of switching transistors. The variable bias current level varies the switching rate of frequency of the switching transistors. The variable bias current level is controlled by an external control voltage where increase of the control voltage results in increase of the transistor switching rate. A pair of diodes are connected to the switching transistors to reduce the rise time of their collector voltages. In one embodiment the constant current source comprises active elements and resistors having small resistance for compatability with manufacture by monolithic integrated circuitry technology.

Figure 1:
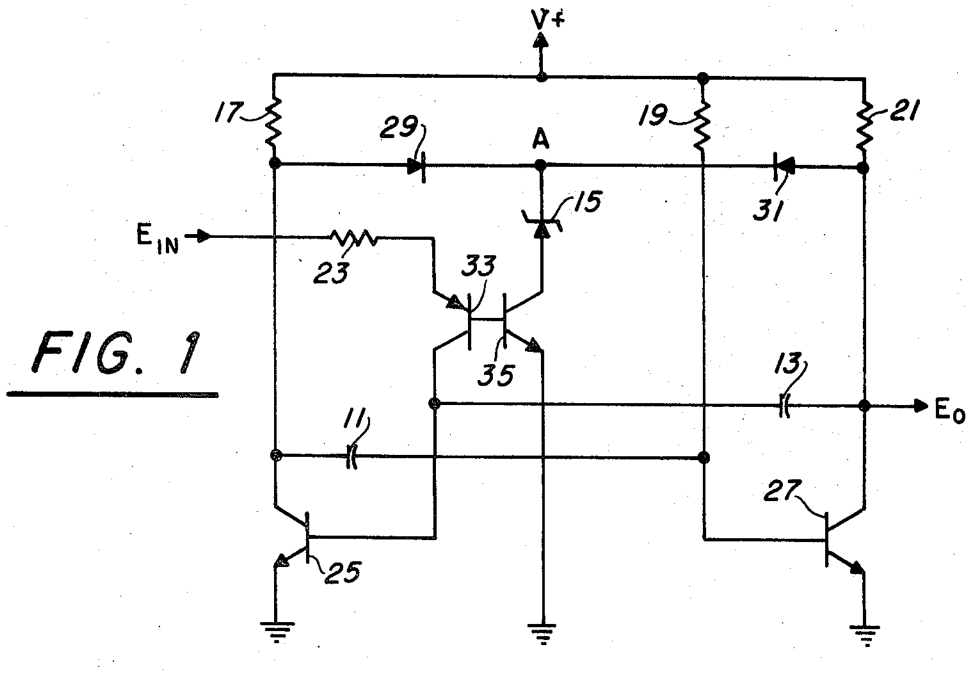

The invention described herein may be manufactured and used by or for the Government of the United States of America for governmental purposes without the payment of any royalties thereon or therefor.

The present invention relates to multivibrator devices and more particularly to voltage controlled astable multivibrator devices.

In voltage controlled astable multivibrator devices it is desirable that the circuit be designed to prevent the simultaneous saturation of the switching pair of transistors which saturation condition is commonly referred to as latch-up. It is also desirable that the voltage control functions so that with an increase in control voltage there is a corresponding increase in frequency of the astable multivibrator output. Still another desirable feature is to have the rise time of the output pulses kept at a minimum. In addition, for manufacture of these devices by monolithic integrated circuitry techniques it is desirable to have maximum use of active devices and to employ resistors, where necessary, of minimum size.

Previous voltage controlled astable multivibrator circuits have complied with some of the above-described desirable features; however, it has been found that these prior circuits have been unable to simultaneously satisfy all of these features. For example, previous circuits have used latch-up protection diode-resistor combinations which could not readily be combined with other diode-resistor combinations used to shorten the rise time. Furthermore, these prior circuits have typically used fairly large resistors which renders them undesirable for manufacture by monolithic integrated circuitry techniques.

The present invention has overcome these disadvantages of prior voltage controlled astable multivibrator devices by a unique circuit that is capable of simultaneously satisfying all of these desirable features. That is, the circuit of the present invention simultaneously prevents latch-up, provides an increase in output frequency with an increase in control voltage, provides a low rise time in output signals, and is particularly suitable for manufacture by monolithic integrated circuitry technology.

This is achieved by using a basic switching pair of transistors and a constant current source that provides a variable bias current level to one transistor in the switching pair of transistors. This current level is controlled by an external control voltage. A pair of diodes are connected to the switching transistors to reduce the rise time of their collector voltages. In one embodiment of the present invention, constant current sources, consisting of active elements and resistors having small resistance, are used for all current controlling throughout the circuit. This renders the circuit particularly suitable for manufacture by monolithic integrated circuitry techniques.

Figure 2:
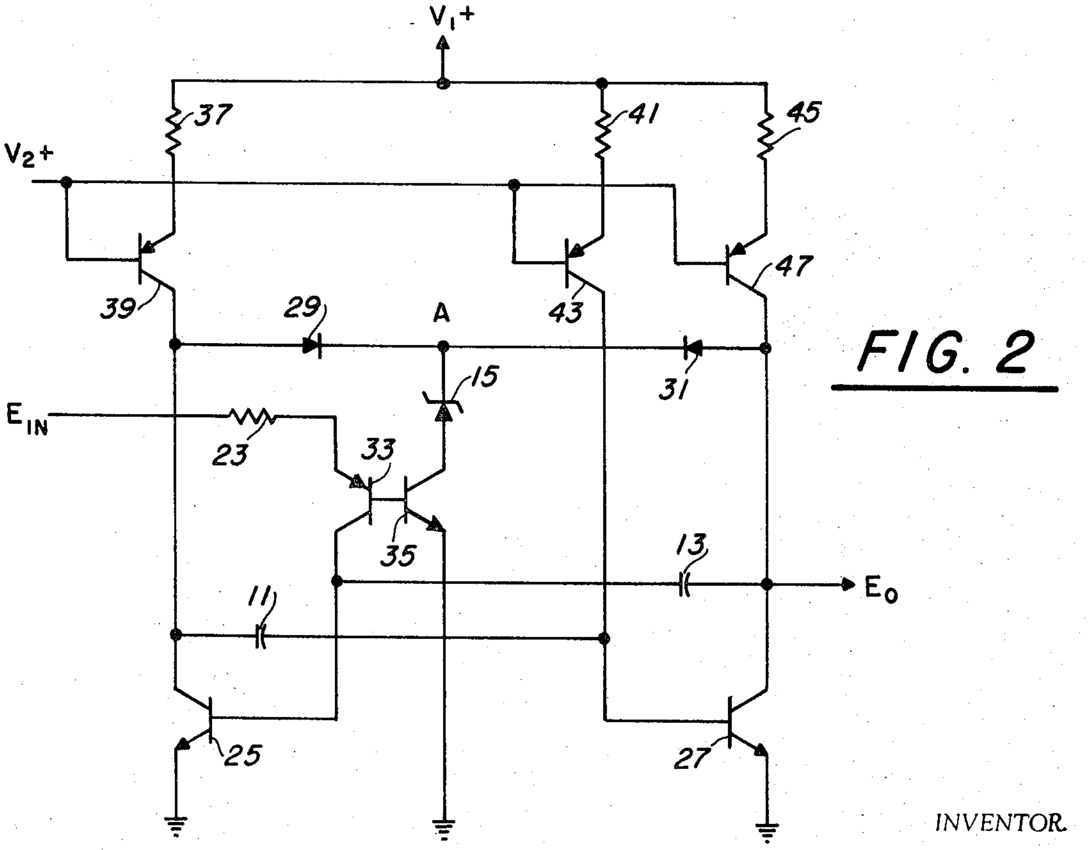

Other objects, advantages and novel features of the invention will become apparent from the following detailed description of the invention when considered in conjunction with the accompanying drawings wherein:

FIG. 1 is a schematic diagram of one embodiment of the astable multivibrator circuit of the present invention; and FIG. 2 is a schematic diagram of another embodiment of the astable multivibrator circuit of the present invention which is particularly suitable for manufacture by monolithic integrated circuitry manufacturing techniques.

Referring now to FIG. 1, $E_{in}$ is a D.C. signal that varies from 0 to $+10^v$., for example, and controls the output signal $E_o$. The output signal $E_o$ is a pulse train output having constant pulse width. The pulse repetition frequency (PRF) of $E_o$ is controlled by $E_{in}$ and will typically vary from about 0 to about 1000 cycles per second but may have a frequency up to about one megacycle. The frequency range is selected, in part, by the choice of capacitors 11 and 13. The pulse height is primarily set by Zener diode 15 and will typically be about 7 volts.

Resistors 17, 19, 21, and 23 determine the bias current levels in the device and therefore also determine the frequency of operation. For example, resistor 17 having a value of 15K, for example, will limit the saturation collector current of transistor 25 to about 1 milliamp, because the collector-to-emitter saturation voltage $$(V_{CE(Sat)})$$

of transistor 25 is typically 0.1 volts so that when transistor 25 is in saturation the voltage across resistor 17 is about 15 volts (15—.1=14.9). Resistor 19, having a value of 150K, for example, limits the saturation base current level of transistor 27 to about 0.1 milliamp because the basis-to-emitter saturation voltage ($V_{CE(Sat)}$) of transistor 27 is typically 0.8 volt so that the voltage across resistor 19 is about 14 volts (15—.8=14.2).

Resistor 21, having a value of 15K, for example, will limit the saturation collector current of transistor 27 to about 1 milliamp, because the collector-to-emitter saturation voltage of transistor 27 ($V_{CE27(Sat)}$) is typically 0.1 volt so that when transistor 27 is in saturation the voltage across resistor 21 is about 15 volts (15—.1=14.9).

In normal operation diodes 29 and 31, Zener diode 15; transistors 33 and 35, and resistor 23 constitute a constant current source which provides a variable bias current level to the base of transistor 25. This current source is controlled by the control voltage $E_{in}$ and utilizes the supply voltage V+, having a voltage of 15 volts, for example, as a reference voltage. In normal operation transistors 25 and 27 of the circuit constitute the basic switching transistor pair of the astable multivibrator circuit. In normal operation either transistor 25 or transistor 27 is cut off (when the other is saturated) so the collector voltage of transistor 25 ($V_{CE1}$) or transistor 27 ($V_{CE2}$) would be at the supply voltage V+ were it not for the effect of the controlled constant current source. For example, assume that transistor 27 is cut-off and therefore transistor 25 is on (saturated). Normally transistor 33 is in the active region (that is, it has linear current gain) and transistor 35 is saturated. Preferably transistor 33 has a low current gain. Assuming that transistor 33 has a current gain ($h_{FE}$) of 1.0 so that it operates as a "current splitter" then the emitter current ($I_{E3}$) divides equally into the base current ($I_{B3}$) and the collector current ($I_{C3}$) in transistor 33. It is the collector current of transistor 33 which is controlled by $E_{in}$. The base current out of transistor 33 is also the base current into transistor 35. Due to the low current gain of transistor 33, the base current out of transistor 35 is large enough to maintain transistor 35 in saturation. The collector current for transistor 35 must come from supply voltage V+ through resistor 17 and diode 29 (or resistor 19 and diode 31) and Zener diode 15. In this normal operation Zener diode 15 is broken down typically at a Zener voltage of 6 volts which means that the voltage of point A is also about 6 volts since the voltage drop from collector to emitter of the saturated transistor 35 is very small, typically 0.1 volt. In this situation transistor 27 is off and current flows from the voltage supply V+ through resistor 21, diode 31, Zener diode 15 and transistor 35 to ground. The voltage across diode 31 is typically 0.6 volt so that the collector voltage of transistor 27 ($V_{CE2}$) is about 7 volts (6.0+0.6=6.6) From this it can be seen that diode 31 acts as a "catching diode" clamping the collector voltage ($V_{CE2}$) of transistor 27 to essentially the voltage at point A. This has the effect of reducing the rise time of the collector voltage of transistor 27 when it switches from on to off. This is because the collector voltage of transistor 27 would have to rise to the value of the supply voltage V+ rather than the lower voltage at point A if the diode 31 were not used.

With transistor 33 in the active region and transistor 25 saturated, the voltage ($V_{C33}$) of the collector of transistor 33 with respect to ground is at about 1.4 volts (.6+.8=1.4) and is generally independent of $E_{in}$. This means that for $E_{in}$ having a value greater than 1.4 volts, the emitter current of transistor 33 is:

(1)
$$I_{E33}=\frac{E_{in}-1\,4v}{R_{23}}=\frac{E_{in}}{100K}-14\mu a$$

That is, the emitter current of transistor 33 is controlled by $E_{in}$ and with the assumed current gain ($h_{FE}$) of 1.0 of transistor 33 the collector current of transistor 33 is half of the emitter current as given by the relationship:

(2)
$$I_{C33}=\frac{I_{E33}}{2}=\frac{E_{in}-1.4v}{2R_{23}}=\frac{E_{in}}{200K}-7\mu a$$

From this it can be seen that the collector current of transistor 33 is controlled by $E_{in}$ as stated above.

The catching diode 29 to the on transistor 25 is necessarily reverse biased since the voltage at the collector or transistor 25 is at about zero and the voltage point A is at about 6.0 volts. That is, no significant amount of current flows through diode 29.

If instead it was assumed that transistor 25 was off and transistor 27 was on, the expression for the controlled current ($I_{C33}$) in terms of the controlling voltage ($E_{in}$) would have been identical to Equation 2. The only difference in this case would be that the collector of transistor 25 would be clamped to the voltage at point A, diode 29 would be conducting and providing the current drive for Zener diode 15 and transistor 35, and diode 31 would be reverse biased.

It should be noted that if $E_{in}$ is less than 1.4 volts (the sum of the normal base-to-emitter voltages of transistor 33 and 25) then the emitter current of transistor 33 and also the collector current of transistor 33 are approximately zero (neglecting leakage currents). When the collector current of transistor 33 is zero than transistor 25 must be off since no base current is supplied to it by transistor 33. This means that transistor 27 must be on and the collector voltage ($V_{CE27}$) of transistor 27 is approximately zero. Therefore, when $E_{in}$ is less than 1.4 volts the output frequency ($f_0$) is zero.

The following is a description of the operation of the circuit shown in FIG. 1 wherein the control voltage ($E_{in}$) has a value, greater than 1.4 volts, such that the controlled current source is providing a current ($I_{C33}$). In this situation the switching pair of transistors 25 and 27 are alternately on and off. The timing parameters of interest are those of the output voltage ($E_0$) waveform. The pulse width ($T_1$) corresponds to the time interval in which transistor 27 is off and transistor 25 is on and the interpulse interval ($T_2$) occurs when transistor 27 is on and transistor 25 is off. During $T_1$ the base voltage ($V_{BE27}$) of transistor 27 is rising exponentially from an initial value of about minus 15 volts toward the supply voltage of 15 volts with a time constant ($R_{19}C_{11}$. The exponential rise terminates at about 0.8 volt so that $T_1$ is approximately given by the expression:

(3)
$$T_1=R_{19}C_{11}1_n\left[\frac{2v+-V_{BE(Sat.)}}{V+}\right]$$
$$=R_{19}C_{11}1_n\left[\frac{29.2}{15}\right]\approx R_{19}C_{11}1_{n2}$$

During $T_2$ the base voltage ($V_{EB25}$) of transistor 25 is rising from an initial value of about minus 15 volts. Since transistor 33 is operating approximately at a constant current source, this voltage rise is linear. $T_2$ is approximately given by the expression:

(4)
$$T_2=\frac{C_{13}V+}{I_{C33}}$$

As previously explained $I_{C33}$ is controlled by $E_{in}$ and substituting for $I_{C33}$ as indicated in Equation 2 gives the expression:

(5)
$$T_2=\frac{C_{13}V+}{\left[\frac{E_{in}-1.4v}{2_{R23}}\right]}=\frac{2R_{23}C_{13}V+}{E_{in}-1.4v}$$

Since the output frequency ($f_0$) is given by the expression (6)
$$f_0=\frac{1}{T_1+T_2}$$

it can be seen, from Equation 5, that the output frequency is controlled by $E_{in}$ and further that the circuit exhibits a positively sloped voltage-to-frequency transfer characteristic. That is, an increase in the input control voltage ($E_{in}$) corresponds to an increase in the output frequency ($f_0$). Similarly a decrease in the input control voltage ($E_{in}$) causes a decrease in the output frequency ($f_0$). As was pointed out previously values of $E_{in}$ less about 1.4 volts result in an output frequency of zero.

In FIG. 2 is illustrated another embodiment of the present invention which is particularly suited to fabrication by monolithic integrated circuit manufacturing techniques. The only differences between the circuit shows in FIG. 2 and the circuit shows in FIG. 1 is that the resistor-transistor constant current sources comprising resistor 37, transistor 39; resistor 41, transistor 43; and resistor 45, and transistor 47 of FIG. 2 are used in place of resistors 17, 19 and 21 and of FIG. 1, respectively. The resistance of resistors 37, 41 and 45 are much lower, for example, 100 ohms, than the resistance of resistors 17, 19 and 21, for example, 15K, 150K and 15K, respectively. In general it is desirable to minimize the resistance values of resistors in monolithic integrated circuits since this decreases the size and hence the cost of the monolithic integrated circuit. Typically the transistors in monolithic integrated circuits are small area devices so that a transistor and a small resistor are preferable to a large resistor when electrical performance of each is equivalent, as in FIG. 2. The voltage of 15 volts and 14.3 volts, respectively, for sources $V_1+$ and $V_2+$ have been used for typical operation. It also has been found that the circuit of FIG. 2 has the additional advantage of having greater stability than the FIG. 1 circuit.

It is to be understood that some of the specific circuitry design may be modified provided such modifications are compatible with the above-described exponents. For example, transistor 35 could have its colletcor and base leads interchanged which tends to improve the circuit operation from the standpoint of obviating latch-up.

What is claimed is:

1. A multivibrator device comprising:
(a) first and second switching transistors;
(b) a current source including first and second diodes and third and fourth transistors;
(c) the bases of said third and fourth transistors being operatively interconnected;
(d) said first and second diodes being operatively connected to said fourth transistors;
(e) said third transistors being operatively connected to said first and second switching transistors; and
(f) a control voltage source being operatively connected to said third transistor to vary the current output of said current source and to vary the switching frequency of said first and second switching transistors.

2. The device of claim 1 wherein:
(a) said first and second diodes are operatively connected to the collectors of said first and second transistors.

3. The device of claim 2 wherein:
(a) a Zener diode is operatively connected between said first and second diodes and said fourth transistor.

4. The device of claim 3 wherein:
(a) said first and second diodes have their respective cathodes connected to the cathode of said Zener diode;
(b) the anode of said first diode connected to the collector of said first transistor; and
(c) the anode of said second diode connected to the collector of said second transistor.

5. The device of claim 4 wherein:
(a) the emitters of said first, second and fourth transistors are connected to ground.

6. The device of claim 5 wherein:
(a) said current source further includes a voltage source and first, second and third resistors;

(b) said first resistor connected between said voltage source and the anode of said first diode;
(c) said second resistor connected between said voltage source and the base of said second transistor; and
(d) said third resistor connected between said voltage source and the anode of said second diode.

7. The device of claim 6 wherein:
(a) a first capacitor is connected between the collector of said first transistor and the base of said second transistor; and
(b) a second capacitor is connected between the base of said first transistor and the collector of said second transistor.

8. The device of claim 6 wherein:
(a) said current source further includes fifth, sixth and seventh transistors wherein;
(b) said fifth transistor is connected between said first resistor and the anode of said first diode;
(c) said sixth transistor is connected between said second resistor and the base of said second transistor; and
(d) said seventh transistor is connectod between said third resistor and the anode of said second diode.

References Cited

UNITED STATES PATENTS

| | | | |
|---|---|---|---|
| 2,976,432 | 3/1961 | Geckle | 331—113 |
| 3,241,087 | 3/1966 | Gossel | 331—113 |
| 3,341,788 | 9/1967 | Nishioka | 331—113 |

FOREIGN PATENTS

| | | |
|---|---|---|
| 1,144,329 | 2/1963 | Germany. |

OTHER REFERENCES

Electronic Design, "Modified Multi Forms Phantastron Oscillator," pp. 46–47, July 5, 1965.

JOHN KOMINSKI, Primary Examiner